(12) United States Patent
Pratt

(10) Patent No.: US 9,071,487 B2
(45) Date of Patent: Jun. 30, 2015

(54) POWER AMPLIFICATION SYSTEM, DEVICE AND METHOD

(71) Applicant: Patrick Pratt, Mallow (IE)

(72) Inventor: Patrick Pratt, Mallow (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 13/971,298

(22) Filed: Aug. 20, 2013

(65) Prior Publication Data

US 2015/0055732 A1    Feb. 26, 2015

(51) Int. Cl.
*H04K 1/02*    (2006.01)
*H04L 25/08*   (2006.01)
*H04L 25/03*   (2006.01)

(52) U.S. Cl.
CPC .......... *H04L 25/08* (2013.01); *H04L 25/03828* (2013.01)

(58) Field of Classification Search
USPC ............ 375/238, 297; 455/127.1, 91; 330/10, 330/149
See application file for complete search history.

(56) References Cited

U.S. PATENT DOCUMENTS

| | | | |
|---|---|---|---|
| 6,141,541 A * | 10/2000 | Midya et al. | 455/91 |
| 6,259,320 B1 * | 7/2001 | Valk et al. | 330/149 |
| 6,300,830 B1 | 10/2001 | Pehlke | |
| 6,366,177 B1 * | 4/2002 | McCune et al. | 332/103 |
| 7,889,811 B2 * | 2/2011 | Byun et al. | 375/297 |
| 8,054,878 B2 * | 11/2011 | Ahn | 375/238 |
| 8,249,530 B2 * | 8/2012 | Sun et al. | 455/127.1 |
| 8,299,851 B2 * | 10/2012 | Zhou et al. | 330/10 |
| 2007/0123184 A1 * | 5/2007 | Nesimoglu et al. | 455/127.1 |
| 2007/0254622 A1 | 11/2007 | Matsuura et al. | |

FOREIGN PATENT DOCUMENTS

EP    1881597 A1    1/2008

OTHER PUBLICATIONS

Chung et al., "Asymmetric Multilevel Outphasing Architecture for Multi-standard Transmitters", IEEE RFIC 2009, Radio Frequency Integrated Circuits Symposium Digest, Jun. 2009, pp. 237-240.
Diet et al., "EER-LINC RF Transmitter Architecture for High PAPR Signals Using Switched Power Amplifiers", Physical Communication, vol. 1, Issue 4, Dec. 2008, pp. 248-254.
Rembold et al., "CLIER—Combination of LINC and EER Method", Electronics Letters, vol. 42, No. 16, Aug. 3, 2006, 2 pages.
Qiuyao Zhu, "Envelope Amplifier for Broadband Base-station Envelope Tracking Power Amplifier", Master's Thesis in Electrical Engineering, University of California San Diego, 2011, pp. 1-125.
Extended European Search Report and Search Opinion issued in counterpart European application No. 14180840.2, communication dated Jan. 7, 2015, 6 pages.

* cited by examiner

*Primary Examiner* — Eva Puente
(74) *Attorney, Agent, or Firm* — Kenyon & Kenyon LLP

(57) ABSTRACT

Embodiments of the present invention may include power amplifier architectures and systems for use in wireless communication systems. The systems may include a first circuit path for receiving an input signal and decomposing the signal into two vector signals using an out-phasing generator, modifying the vectors based on predetermined value limit, amplifying the vectors using power amplifiers, and combining the vectors to provide an amplified output. The system may include a second circuit path for generating an estimate of an envelope of the input signal and using the envelope to modulate the voltage supplies of the power amplifiers when amplifying the vector signals. The system may also include a feedback path for sending information regarding the envelope of the input signal into the out-phasing generator, which may modify the vector signals in response thereto.

20 Claims, 4 Drawing Sheets

100

200

300

400

POWER AMPLIFICATION SYSTEM, DEVICE AND METHOD

BACKGROUND

The present invention relates to power amplifiers for use in wireless communication systems.

In wireless communication systems, digital signals are transmitted in order to facilitate communication. The signals used in these systems often are phase and amplitude modulated to encode transmitted information. Power amplifiers are used to amplify these low-power, modulated signals prior to transmission. Existing power amplifiers in wireless communication systems suffer from several problems, such as non-linearity and inefficiency issues. Examples of these conventional power amplifiers are linear amplification with nonlinear components (Linc) amplifiers and envelope elimination and restoration (EER) amplifiers.

Linc amplifier systems decompose an input signal into two phase-modulated vector signals with constant amplitudes. Power amplifiers amplify the vectors and a power combiner combines them to generate a power-amplified output signal. However, as the difference between the phases of the vector signals increase, the power combiner wastes more power and becomes increasingly inefficient.

EER amplifier systems split an input signal into a variable amplitude modulated signal and a phase modulated signal with a constant amplitude. A power amplifier amplifies the phase modulated signal. A modulator circuit modulates the supply voltage of the power amplifier based on the amplitude modulate signal. Ideally, the output signal would be an amplified version of the input signal. Although the EER system is somewhat efficient, its linearity is significantly limited by the bandwidth limitations of its modulator circuit.

As the demand for faster and more efficient mobile communications devices continues to increase, the demand for radio frequency (RF) transmitters supporting higher data transmission rates also has increased. In existing systems, these higher data transmission rates have been implemented by increasing the bandwidth of data signals transmitted by the RF transmitters. To support these wider bandwidths, the bandwidth requirements for power amplifiers used in RF transmitters have also been increased. Increased bandwidth problems further compound non-linearity and inefficiency problems, therefore existing power amplifier architectures are becoming obsolete. Thus, there is a need in for wide bandwidth, highly efficient and linear power amplifiers for use in wireless communication systems.

DETAILED DESCRIPTION

Embodiments of the present invention may include power amplifier architectures and systems for use in wireless communication systems. The systems may include a first circuit path for receiving an input signal and decomposing the signal into two vector signals using an out-phasing generator, modifying the vectors based on predetermined value limit, amplifying the vectors using power amplifiers, and combining the vectors to provide an amplified output. The system may include a second circuit path for generating an estimate of an envelope of the input signal and using the envelope to modulate the voltage supplies of the power amplifiers when amplifying the vector signals. The system may also include a feedback path for sending information regarding the envelope of the input signal into the out-phasing generator, which may modify the vector signals in response thereto.

Figure 1:
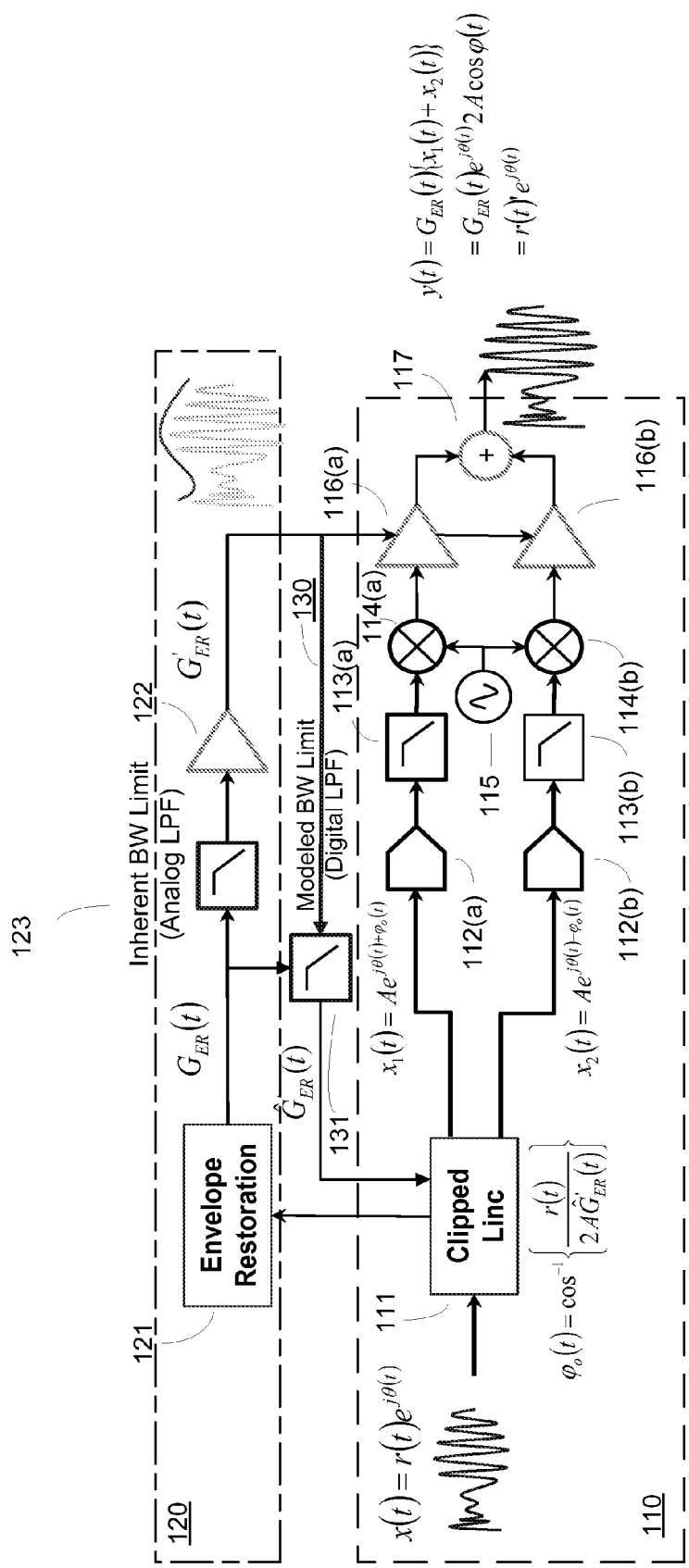
FIG. 1 is a simplified block diagram of an amplifier system according to an embodiment of the present invention.

FIG. 1 is a simplified block diagram of a power amplifier system 100 according to an embodiment of the present invention. The system 100 may include a first circuit path 110, a second circuit path 120, and a feedback path 130. The system 100 may receive an input radio frequency (RF) signal x(t) to be amplified, which may be represented by the following equation:

$$x(t) = r(t)e^{j\theta(t)}, \quad \text{Eq. (1)}$$

where r(t) represents the time-varying amplitude of the input signal x(t) and θ(t) represents the time-varying phase of the input signal x(t). The system 100 may output a signal y(t), which may be a power-amplified version of the input signal x(t) (described in further detail below). Ideally, y(t) would be an amplified version of the input signal (y(t)=k*x(t)) without time-varying amplitude or phase distortion.

The first circuit path 110 may be a Linc-type amplifier circuit and may include a Clipped Linc generator 111, digital-to-analog converters (DACs) 112(a) and 112(b), low pass filters (LPFs) 113(a) and 113(b), frequency translation mixers 114(a) and 114(b), power amplifiers 116(a) and 116(b), and a power combiner 117. The Linc path 110 may receive the input signal x(t) and decompose it into two vector signals $x_1(t)$ and $x_2(t)$. The vector signals may eventually be clipped by the Clipped Linc generator 111, amplified by amplifiers 116(a) and 116(b), and combined by the power combiner 117 to generate the amplified output y(t).

The second path 120 may be an envelope restoration (ER)-type circuit and may include an ER block 121 and an envelope amplifier 122. The ER path may calculate a gain $G_{ER}(t)$ which may modulate the voltage supplies of the power amplifiers 116(a) and 116(b) of the Linc path 110. The ER path 120 may include an inherent bandwidth limitation (this mainly represents the bandwidth limitation of the envelope amplifier 122), which may be expressed or modeled by an analog LPF 123. The inherent bandwidth limitation may be a linear, small signal effect or a nonlinear, large signal effect (i.e., slew rate limitation).

The feedback path 130 may be provided between the output of the ER path 120 and the Clipped Linc generator 111. The feedback path 130 may include a bandwidth limitation estimator 131 that may estimate the bandwidth limitation of the ER path 120. The bandwidth limitation estimator 131 may be represented as a digital LPF that models the corresponding analog LPF 123 in the ER path 120. A more detailed architecture of the model 131 will be described below with respect to FIG. 2.

As noted above, the Clipped Linc generator 111 may receive the input signal x(t) and decompose it into two vector signals $x_1(t)$ and $x_2(t)$, which represent the input signal x(t). The vector signals $x_1(t)$ and $x_2(t)$ may be defined by the following equations:

$$x_1(t) = Ae^{j\theta(t)+\phi(t)}, \quad \text{Eq. (2)}$$

$$x_2(t) = Ae^{j\theta(t)-\phi(t)}, \quad \text{Eq. (3)}$$

where A may be an amplitude of each vector signal $x_1(t)$ and $x_2(t)$, θ(t) may be a time-varying phase of the input signal x(t), and φ(t) may be an initial out-phasing angle of each vector signal $x_1(t)$ and $x_2(t)$. The initial out-phasing angle $\phi(t)$ may represent the absolute phase difference between the phase of the input signal elm and the phase of each respective vector signal $x_1(t)$ and $x_2(t)$. For example, the phase of the first vector signal $x_1(t)$ may be equal to the phase of the input signal $\theta(t)$ plus the out-phasing angle $\phi(t)$. Similarly, the phase of the second vector signal $x_2(t)$ may be equal to the phase of the input signal $\theta(t)$ minus the out-phasing angle $\phi(t)$.

The vector signals $x_1(t)$ and $x_2(t)$ may have the same, constant amplitude A that does not vary with time (i.e., they may have the same, constant Linc envelope). The Clipped Linc generator 111 may clip (or limit) the out-phasing angle to an initial predetermined angle or phase value. For example, say the predetermined angle limit is set to 75°. If an initial out-phasing angle $\phi(t)$ for the vector signals $x_1(t)$ and $x_2(t)$ is 90°, the Clipped Linc generator 111 may limit the initial out-phasing angle $\phi(t)$ to 75°. If the initial out-phasing angle $\phi(t)$ is less than or equal to 75°, the Clipped Linc generator 111 not modify the initial out-phasing angle $\phi(t)$. The phase-clipped vectors signal $x_1(t)$ and $x_2(t)$ may be defined by the following equations:

$$x_1(t) = A e^{j(\theta(t) + \phi_0(t))}, \quad \text{Eq. (4)}$$

$$x_2(t) = A e^{j(\theta(t) - \phi_0(t))}, \quad \text{Eq. (5)}$$

where $\phi_0$ may represent the phase-clipped (if the phase is indeed clipped) out-phasing angle for each vector signal $x_1(t)$ and $x_2(t)$. The phase-clipped out-phasing angle may be updated based on the gain fed back into the Clipped Linc generator 111 through the feedback path 130 (described in further detail below).

During operation, the first vector signal $x_1(t)$ may be input into a first branch of the Linc path 110 including the DAC 112(a), the LPF 113(a) (or reconstruction filter), the frequency translation mixer 114(a), and the power amplifier 116(a). The second vector signal $x_2(t)$ may be input into a second branch of the first path 110 including the DAC 112(b), the LPF 113(b), the frequency translation mixer 114(b), and the power amplifier 116(b).

The DACs 112(a) and 112(b) may receive the respective first vector signal $x_1(t)$ and second vector signal $x_2(t)$ and convert them into corresponding analog signals. The analog versions of the vector signals $x_1(t)$ and $x_2(t)$ may be input into respective LPFs to remove signal images at multiples of the sample rate of the DACs 112(a) and 112(b). After DAC reconstruction, the vector signals $x_1(t)$ and $x_2(t)$ each may be input into respective frequency translation mixers 114(a) and 114(b), which may translate the signals to a radio frequency 115 at which the power amplifiers 116(a) and 116(b) operate. The translated signals subsequently may be input into the power amplifiers 116(a) and 116(b) for amplification and output to power combiner 117. The power combiner 117 may combine the amplified, analog versions of the vector signals $x_1(t)$ and $x_2(t)$ and output an amplified, analog signal y(t), which may be a power amplified version of the input signal x(t).

The ER block 121 may receive the amplitude component r(t) of the input signal x(t), the clipped out-phasing angle $\phi_0(t)$, and the scalar amplitude A of the Linc envelope of the vector signals $x_1(t)$ and $x_2(t)$ from the Clipped Linc generator 111 of the Linc path 110. The instantaneous values for r(t) and $\phi_0(t)$ and the constant A value may be used by the ER block 121 to calculate an idealized gain term $G_{ER}(t)$, which may be amplified by the amplifier 122. The amplifier 122 may output an actual gain value $G'_{ER}(t)$, which may be a high powered, but bandwidth-limited version of the ideal gain $G_{ER}(t)$. The actual ER gain $G'_{ER}(t)$ may be applied to the power amplifiers 116(a) and 116(b) in the Linc path 110.

In the feedback path 130, the model 131 may receive the idealized gain $G_{ER}(t)$ and actual gain $G'_{ER}(t)$ values and derive an estimate gain $\hat{G}'_{ER}(t)$ of the actual gain $G'_{ER}(t)$ (described in further detail below with respect to FIG. 2). The estimated gain $\hat{G}'_{ER}(t)$ may be fed-back into the Clipped Linc generator 111. The Clipped Linc generator 111 may update the value of the clipped out-phasing angle $\phi_0(t)$ based on the instantaneous value of the estimated gain $\hat{G}'_{ER}(t)$ according to the following equation:

$$\varphi_o(t) = \cos^{-1}\left\{\frac{r(t)}{2A\hat{G}'_{ER}(t)}\right\} \quad \text{Eq. (6)}$$

The Clipped Linc generator may update the vector signals $x_1(t)$ and $x_2(t)$ based on the updated out-phasing angle defined by equation 6 above. The updated signals $x_1(t)$ and $x_2(t)$ may be fed into the first and second branch of the Linc path 110 as described above. The output signal y(t) may be defined by the following equation:

$$y(t) = G_{ER}(t)\{x_1(t) + x_2(t)\} = G_{ER}(t)e^{j\theta t}2A\cos\phi(t) = K \cdot r(t)e^{j\theta t}, \quad \text{Eq. (7)}$$

where K represents an amplification constant corresponding to a power-amplified amplitude of the output signal y(t).

The system 100 described above with respect to FIG. 1 has several advantages over brute force combinations of ER and Linc systems. The phase-clipping may reduce the peak-to-average power ratio (PAPR) of the Linc path 110 and therefore reduce losses at the power combiner 117 (i.e., increase power efficiency). The ER path's 120 gain applied to the power amplifiers 116(a) and 116(b) may restore low frequency amplitude modulation components of the input signal x(t) that otherwise would be clipped by the Clipped Linc generator 111 to maintain linearity in the system 100.

Moreover, in the embodiment described above with respect to FIG. 1, as the bandwidth of the ER path 120 approaches zero, the system 100 may tend to operate more like a pure Linc architecture with no clipping. Conversely, as the clipping angle approaches 90° and the bandwidth of the ER path 120 increases, the system 100 may operate more like a pure envelope elimination restoration (EER) system. Thus, operation of the system 100 may vary naturally among a pure Linc mode, a pure EER mode, or some combination of both to optimize the efficiency of the system 100 depending on the bandwidth limitations of the ER path 120 and the input signal x(t).

According to an embodiment of the present invention, the components in the feedback path 130 may be powered down unless the value of $\hat{G}'_{ER}(t)$ needs to be updated. In such a case, the feedback path 130 may be powered on to calculated an updated version of $\hat{G}'_{ER}(t)$. Otherwise, the feedback path 130 may supply a previously calculated version of $\hat{G}'_{ER}(t)$ to the Linc path 110 and remain powered down.

Figure 2:
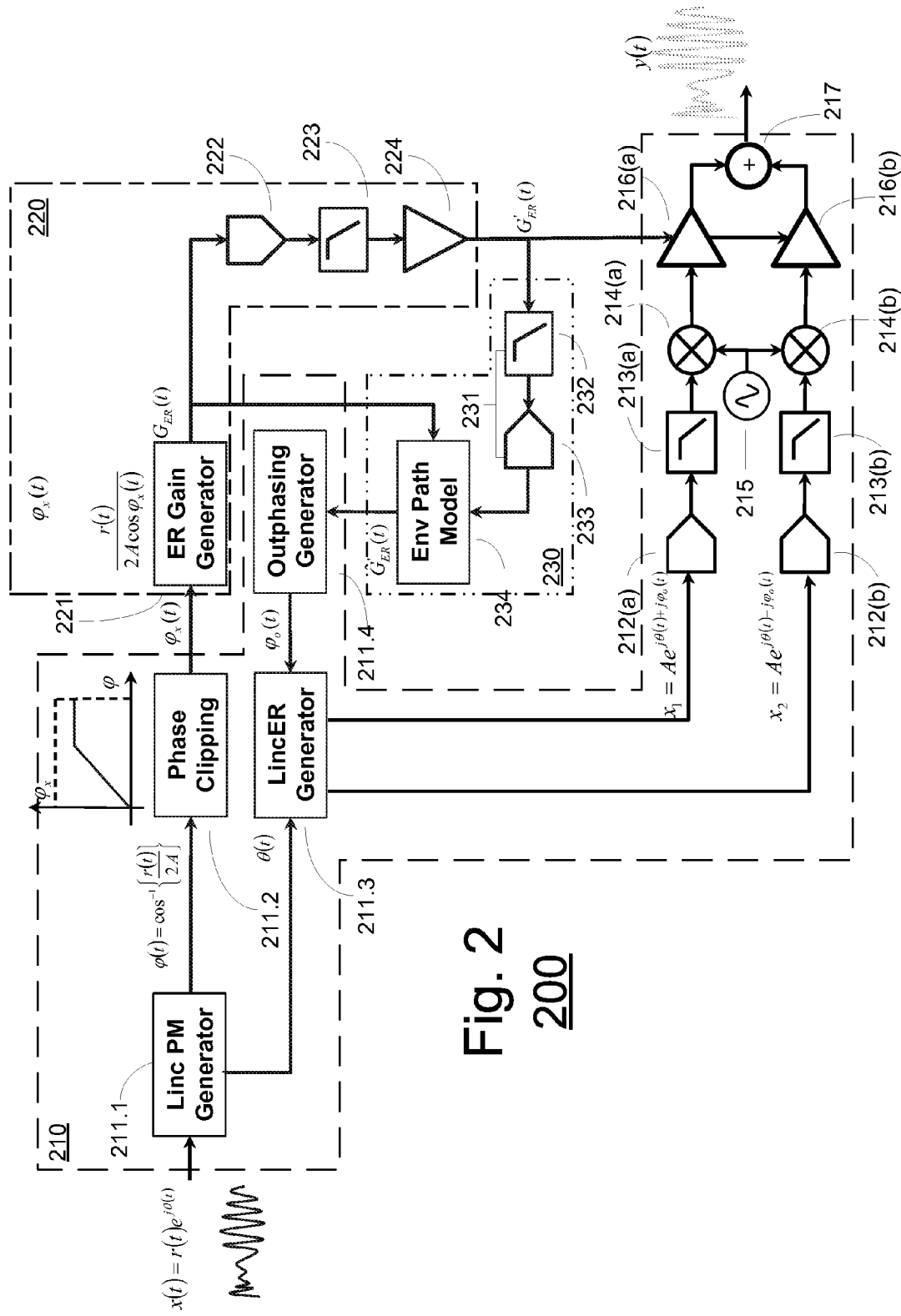
FIG. 2 is a simplified block diagram of an exemplary phase-clipping power amplifier system according to an embodiment of the present invention.

FIG. 2 is a simplified block diagram of an exemplary phase-clipping power amplifier system 200 according to an embodiment of the present invention. The amplifier system 200 may include a Linc circuit path 210, an ER circuit path 220, and a feedback path 230. The system 200 may receive an input RF signal x(t) which may be represented by the following equation:

$$x(t) = r(t)e^{j\theta(t)}, \quad \text{Eq. (8)}$$

where r(t) represents the time-varying amplitude of the input signal x(t) and $\theta(t)$ represents the time-varying phase of the input signal x(t). The system 200 may output a signal y(t), which may be a power-amplified version of the input signal x(t) (described in further detail below). Ideally, y(t) would be an amplified version of the input signal (y(t)=k*x(t)) without time-varying amplitude or phase distortion.

The Linc path 210 may be a Linc-type amplifier circuit, which may include a Linc phase modulation (PM) generator 211.1, a phase clipping block 211.2, a LincER generator 211.3, an out-phasing generator 211.4, digital-to-analog converters (DACs) 212(a) and 212(b), LPFs 213(a) and 213(b), frequency translation mixers 214(a) and 214(b), power amplifiers 216(a) and 216(b), and a power combiner 217. The Linc path 210 may receive the input signal x(t) and decompose it into two vector signals $x_1(t)$ and $x_2(t)$. The vector signals $x_1(t)$ and $x_2(t)$ may eventually be phase-clipped by the phase clipping block 211.2, amplified by amplifiers 216(a) and 216(b), and combined by the power combiner 217 to generate the amplified output y(t).

The ER path 220 may be an ER-type circuit and may include an ER gain generator 221, an ER DAC 222, a reconstruction filter (RCF) 223, and an envelope amplifier 224. The ER path 220 may calculate a gain $G_{ER}(t)$ which may be used to modulate the power amplifiers 216(a) and 216(b) of the Linc path 210. The ER path 220 may include an inherent bandwidth limitation (not shown), which may be modeled by the feedback path 230.

The feedback path 230 may include an envelope detector 231 and bandwidth limit estimator 234. The envelope detector 231 may include a LPF 232 followed by an analog-to-digital converter (ADC) 233. The bandwidth limit estimator 234 may estimate the effect of bandwidth limitations of the ER path 220 on the gain $G_{ER}(t)$. The estimator 234 may develop a non-linear model, such as a memory polynomial model, which may be capable of estimating an actual, bandwidth-limited gain of the ER path 220. The estimated gain may be fed-back into the Linc path 210.

During operation, the Linc PM generator 211.1 may receive the input signal x(t) and feed the phase θ(t) of the original signal x(t) to the LincER generator 211.3. The Linc PM generator 211.1 may also calculate an initial out-phasing angle φ(t) of the two vector signals $x_1(t)$ and $x_2(t)$, which may be represented by the following equation:

$$\varphi(t) = \cos^{-1}\left\{\frac{r(t)}{2A}\right\}, \quad \text{Eq. (9)}$$

where A represents a constant amplitude of each vector signal $x_1(t)$ and $x_2(t)$ generated by the LinER generator 211.3 (described in further detail below). The calculated initial out-phasing value φ(t) may be phase clipped (or limited) at a predetermined phase-clipping angle by the phase clipping block 211.2 (the phase clipping technique is described above in more detail with respect to FIG. 1). The phase clipping block 211.1 may output an initial clipped out-phasing angle $\phi_x(t)$ to the ER gain generator 221 of the ER path 220.

The ER gain generator 221 may receive the clipped out-phasing angle $\phi_x(t)$ from the phase clipping block 211.1 and may generate an idealized, wide bandwidth envelope gain term $G_{ER}(t)$. The idealized envelope gain may be determined according to the following equation:

$$G_{ER}(t) = \frac{r(t)}{2A\cos\varphi_x(t)} \quad \text{Eq. (10)}$$

The ER DAC 222 and the RCF 223 may receive the idealized gain $G_{ER}(t)$ and convert it into an analog waveform. The envelope amplifier 224 may receive the analog version of the low power, wide bandwidth $G_{ER}(t)$ signal and attempt to gain the signal up to a high power, wide bandwidth signal. However, due to the slew rate limitations of the amplifier 224, the output of the envelope amplifier 224, or actual envelope gain $G'_{ER}(t)$, may be a high powered but bandwidth-limited version of the idealized gain signal $G_{ER}(t)$ generated by the ER gain generator 221. The actual envelope gain $G'_{ER}(t)$ may be used to modulate the voltage supplies of the power amplifiers 216(a) and 216(b).

In the feedback path 230, the envelope detector 213 may measure the actual envelope gain $G'_{ER}(t)$, digitize the signal using the ADC 233, and input the digitized version of $G'_{ER}(t)$ into the estimator 234. The bandwidth limit estimator 234 may also receive the idealized envelope gain $G_{ER}(t)$ from the ER gain generator 221. The estimator 234 may utilize the idealized gain $G_{ER}(t)$ and actual gain $G'_{ER}(t)$ values to derive an estimate gain $\hat{G}'_{ER}(t)$ of the actual gain $G'_{ER}(t)$. The estimated gain $\hat{G}'_{ER}(t)$ may be fed-back into the out-phasing generator 211.4 of the Linc path 210. The instantaneous value of $\hat{G}'_{ER}(t)$ may be used by the out-phasing generator 211.4 to provide an updated value of the clipped out-phasing angle $\phi_0(t)$ according to the following equation:

$$\varphi_o(t) = \cos^{-1}\left\{\frac{r(t)}{2A\hat{G}'_{ER}(t)}\right\} \quad \text{Eq. (11)}$$

The updated clipped out-phasing angle $\phi_0(t)$ may be transmitted to the LincER generator 211.3. The LincER generator 211.3 may derive the vector signals $x_1(t)$ and $x_2(t)$ based on the phase θ(t) of the input signal x(t) received from the Linc PM generator 211.1 and the updated clipped out-phasing angle $\phi_0(t)$ received from the out-phasing generator 211.4.

The updated, clipped signal vectors $x_1(t)$ and $x_2(t)$, may be defined by the following equations:

$$x_1(t) = Ae^{j\Theta(t)+\phi_0(t)}, \quad \text{Eq. (12)}$$

$$x_2(t) = Ae^{j\Theta(t)-\phi_0(t)} \quad \text{Eq. (13)}$$

The DACs 212(a) and 212(b) may receive the respective first vector signal $x_1(t)$ and second vector signal $x_2(t)$ and convert them into corresponding analog signals. The analog versions of the vector signals $x_1(t)$ and $x_2(t)$ may be input into respective LPFs 213(a) and 213(b). The vector signals $x_1(t)$ and $x_2(t)$ each may be input into respective frequency translation mixers 214(a) and 214(b), which may translate the signals to a radio frequency 215 at which the power amplifiers 216(a) and 216(b) operate. The translated signals $x_1(t)$ and $x_2(t)$ subsequently may be input into the power amplifiers 216(a) and 216(b) for amplification and output to power combiner 217. The supply voltages of the power amplifiers 216(a) and 216(b) may be modulated by the actual envelope gain $G'_{ER}(t)$. The power combiner 217 may combine the amplified, analog versions of the vector signals $x_1(t)$ and $x_2(t)$ and output an amplified, analog signal y(t), which may be a power amplified version of the input signal x(t).

The system 200 described above with respect to FIG. 2 has several advantages over brute force combinations of ER and Linc systems. The phase-clipping may reduce the PAPR of the Linc path 210 and therefore reduce losses at the combiner 217. The ER path's 220 gain applied to the power amplifiers 216(a) and 216(b) may restore low frequency amplitude modulation components of the input signal x(t) that otherwise would be clipped by the LincER generator 211.3 to maintain linearity in the system 200.

Moreover, in the embodiment described above with respect to FIG. 2, as the bandwidth of the ER path 220 approaches zero, the system 200 may tend to operate more like a pure Linc architecture with no clipping. Conversely, as the clipping angle approaches 90° and the bandwidth of the ER path 220 increases, the system 200 may operate more like a pure envelope elimination restoration (EER) system. Thus, operation of the system 200 may vary naturally among a pure Linc mode, a pure EER mode, or some combination of both to optimize the efficiency of the system 200 depending on the bandwidth limitations of the ER path 220 and the input signal x(t).

According to an embodiment of the present invention, the components in the feedback path 230 may be powered down unless the value of $\hat{G}'_{ER}(t)$ needs to be updated. In such a case, the feedback path 230 may be powered on to calculated an updated version of $\hat{G}'_{ER}(t)$. Otherwise, the feedback path 230 may supply a previously calculated version of $\hat{G}'_{ER}(t)$ to the Linc path 210 and remain powered down.

Figure 3:
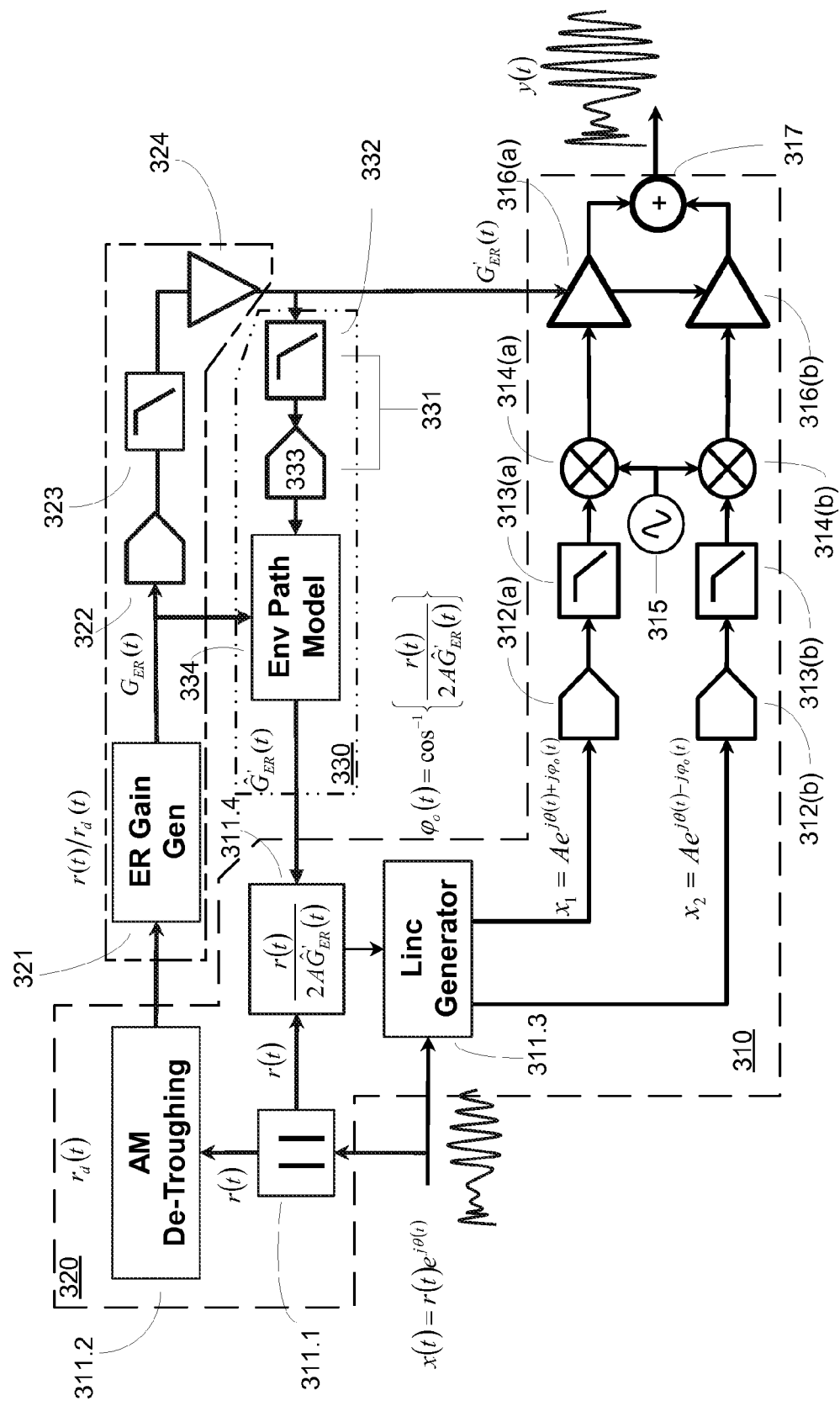
FIG. 3 is a simplified block diagram of an exemplary amplitude modulation (AM) de-troughing power amplifier system according to an embodiment of the present invention.

FIG. 3 is a simplified block diagram of an exemplary de-troughing power amplifier system 300 according to an embodiment of the present invention. The amplifier system 300 may include a Linc circuit path 310, an ER circuit path 320, and a feedback path 330. The system 300 may receive an input RF signal x(t) which may be represented by the following equation:

$$x(t) = r(t)e^{j\theta(t)}, \quad \text{Eq. (14)}$$

where r(t) represents the time-varying amplitude of the input signal x(t) and θ(t) may represents the time-varying phase of the input signal x(t). The system 300 may output a signal y(t), which may be a power-amplified version of the input signal x(t) (described in further detail below). Ideally, y(t) would be an amplified version of the input signal (y(t)=k*x(t)) without time-varying amplitude or phase distortion.

The Linc path 310 be a Linc-type amplifier circuit and may include an envelope detector 311.1, an AM de-troughing block 311.2, a Linc generator 311.3, an out-phasing generator 311.4, DACs 312(a) and 312(b), LPFs 313(a) and 313(b), frequency translation mixers 314(a) and 314(b), power amplifiers 316(a) and 316(b), and a power combiner 317. The Linc path 310 may receive the input signal x(t) and decompose it into two vector signals $x_1(t)$ and $x_2(t)$. The vector signals may eventually be de-troughed (described in more detail below) by the AM de-troughing block 311.2, amplified by amplifiers 316(a) and 316(b), and combined by the power combiner 317 to generate the amplified output y(t).

The ER path 320 may be an ER-type circuit and may include an ER gain generator 321, an ER DAC 322, a reconstruction filter (RCF) 323, and an envelope amplifier 324. The ER path 320 may calculate a gain $G_{ER}(t)$ which may be used to modulate the voltage supplies of the the power amplifiers 316(a) and 316(b) of the Linc path 310. The ER path 320 may include an inherent bandwidth limitation (not shown), which may be modeled by the feedback path 330.

The feedback path 330 may include an envelope detector 331 and a bandwidth limit estimator 334. The envelope detector 331 may include a LPF 332 followed by an ADC 333. The bandwidth limit estimator 334 may estimate the inherent bandwidth limitation of the gain $G_{ER}(t)$ in the ER path 320. The estimator 334 may develop a non-linear model, such as a memory polynomial model, which may be capable of estimating an actual, bandwidth-limited gain of the ER path 320. The estimated gain may be fed-back into the Linc path (described in further detail below).

During operation, the envelope detector 311.1 may receive the input signal x(t) and output the amplitude modulated component r(t) of the input signal x(t) to the AM de-troughing block 311.2. The AM de-troughing block may de-trough, or limit the troughs, of the amplitude modulate component signal r(t) according to a pre-defined trough limit. For example, say the predetermined limit is set to Z. If the initial amplitude r(t) of the input signal x(t) is less than Z, the AM de-troughing block 311.2 may limit the initial r(t) value to Z. If the initial amplitude r(t) is greater than or equal to Z, the AM de-troughing block 311.2 may not modify the initial amplitude r(t). A de-troughed amplitude $r_d(t)$ may be output from the AM de-troughing block 311.2.

The de-troughed signal $r_d(t)$ may be input into the ER generator 321, which may generate an idealized, wide bandwidth envelope gain term $G_{ER}(t)$ based on a ratio of r(t) and $r_d(t)$ as defined by the following equation:

$$G_{ER}(t) = \frac{r(t)}{r_d(t)} \quad \text{Eq. (15)}$$

The ER DAC 322 and the RCF 323 may receive the idealized gain $G_{ER}(t)$ and convert it into an analog waveform. The envelope amplifier 324 may receive the analog version of the low power, wide bandwidth $G_{ER}(t)$ signal and attempt to gain the signal up to a high power, wide bandwidth signal. However, due to the slew rate limitations of the amplifier 324, the output of the envelope amplifier 334, or the actual envelope gain $G'_{ER}(t)$, may be a high powered but bandwidth-limited version of the idealized gain signal $G_{ER}(t)$ generated by the ER gain generator 321. The actual envelope gain $G'_{ER}(t)$ may modulate the voltage supplies of the power amplifiers 316(a) and 316(b).

In the feedback path 330, the envelope detector 313 may measure the actual envelope gain $G'_{ER}(t)$, digitize the signal using the ADC 333, and input the digitized version of $G'_{ER}(t)$ into the bandwidth limit estimator 334. The estimator 334 may also receive the idealized envelope gain $G_{ER}(t)$ from the ER gain generator 321. The model 334 may utilize the idealized gain $G_{ER}(t)$ and actual gain $G'_{ER}(t)$ values to derive an estimate gain $\hat{G}'_{ER}(t)$ of the actual gain $G'_{ER}(t)$. The estimated gain $\hat{G}'_{ER}(t)$ may be fed-back into the out-phasing generator 311.4 of the Linc path 310. The out-phasing generator 311.4 may provide an updated value of the de-troughed out-phasing angle $\phi_0(t)$ based on the instantaneous value of $\hat{G}'_{ER}(t)$, as defined by the following equation:

$$\varphi_o(t) = \cos^{-1}\left\{\frac{r(t)}{2A\hat{G}'_{ER}(t)}\right\} \quad \text{Eq. (16)}$$

The updated, de-troughed angle $\phi_0(t)$ may be transmitted to the Linc generator 311.3. The Linc generator 311.3 may derive the vector signals $x_1(t)$ and $x_2(t)$ based on phase θ(t) of the input signal x(t) and the updated de-troughed angle $\phi_0(t)$ received from the out-phasing generator 311.4.

The updated, de-troughed vectors $x_1(t)$ and $x_2(t)$ may be defined by the following equations:

$$x_1(t) = Ae^{j\theta(t)+\phi_0(t)}, \quad \text{Eq. (17)}$$

$$x_2(t) = Ae^{j\theta(t)-\phi_0(t)} \quad \text{Eq. (18)}$$

The DACs 312(a) and 312(b) may receive the respective first vector signal $x_1(t)$ and second vector signal $x_2(t)$ and convert them into corresponding analog signals. The analog versions of the vector signals $x_1(t)$ and $x_2(t)$ may be input into respective LPFs 313(a) and 313(b). The vector signals $x_1(t)$ and $x_2(t)$ each may be input into respective frequency translation mixers 314(a) and 314(b), which may translate the signals to a radio frequency 315 at which the power amplifiers 316(a) and 316(b) operate. The translated signals subsequently may be input into the power amplifiers 316(a) and 316(b) for amplification and output to power combiner 317. The supply voltages of the power amplifiers 316(a) and 316(b) may be modulated by the actual envelope gain $G'_{ER}(t)$. The power combiner 317 may combine the amplified, analog versions of the vector signals $x_1(t)$ and $x_2(t)$ and output an amplified, analog signal y(t), which may be a power amplified version of the input signal x(t).

The system 300 described above with respect to FIG. 3 has several advantages over brute force combinations of ER and Linc systems. The de-troughing may reduce the PAPR of the Linc path 310 and therefore reduce losses at the combiner 317. The ER path's 320 gain applied to the power amplifiers 316(a) and 316(b) may restore low frequency amplitude modulation components of the input signal x(t) that otherwise would be de-troughed by the AM de-troughing block 311.2 to maintain linearity in the system 300.

Moreover, in the embodiment described above with respect to FIG. 3, as the bandwidth of the ER path 320 approaches zero, the system 300 may tend to operate more like a pure Linc architecture with no clipping. Conversely, as the de-troughing amplitude increases and the bandwidth of the ER path 320 increases, the system 300 may operate more like a pure envelope elimination restoration (EER) system. Thus, operation of the system 300 may vary naturally among a pure Linc mode, a pure EER mode, or some combination of both to optimize the efficiency of the system 300 depending on the bandwidth limitations of the ER path 320 and the input signal x(t).

According to an embodiment of the present invention, the components in the feedback path 330 may be powered down unless the value of $\hat{G}'_{ER}(t)$ needs to be updated. In such a case, the feedback path 330 may be powered on to calculated an updated version of $\hat{G}'_{ER}(t)$. Otherwise, the feedback path 330 may supply a previously calculated version of $\hat{G}'_{ER}(t)$ to the Linc path 310 and remain powered down.

Figure 4:
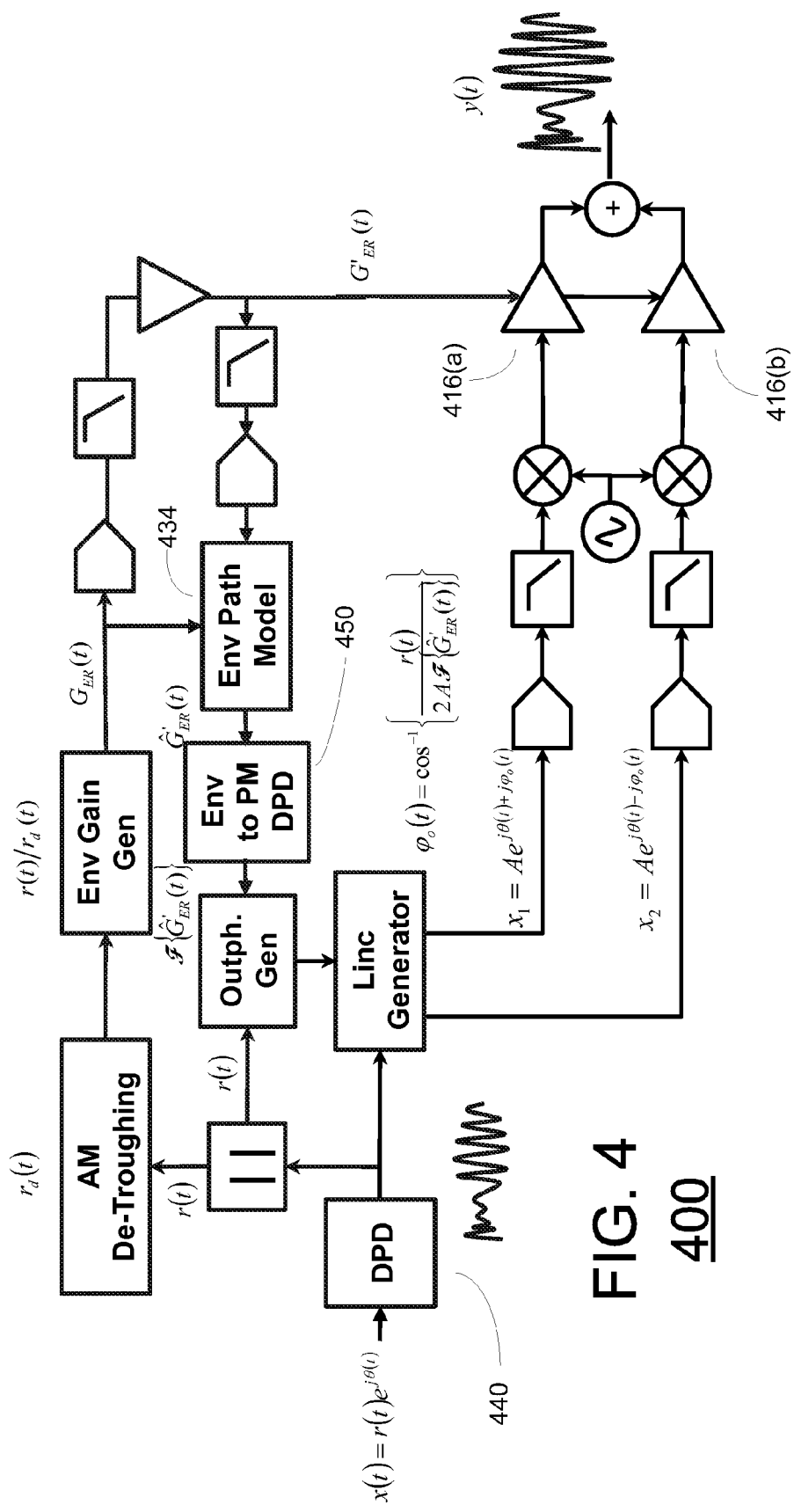
FIG. 4 is a simplified block diagram of an exemplary AM de-troughing power amplifier system utilizing digital pre-distortion (DPD) techniques according to an embodiment of the present invention.

FIG. 4 is a simplified block diagram of an exemplary AM de-troughing power amplifier system 400 utilizing digital pre-distortion (DPD) techniques according to an embodiment of the present invention. The basic architecture of the amplifier system 400 may be similar to the de-troughing amplifier system 300 of FIG. 3, however, the system 400 may include DPD blocks 440 and 450. The DPD block 440 may apply an amplitude modulation (AM) distortion function to the input signal x(t). Moreover, the envelope to phase modulation DPD block 450 may apply a PM distortion function to the estimated envelope gain $\hat{G}'_{ER}(t)$ generated by the bandwidth limit estimator 434. Thus, the out-phasing angle generator 411.4 may use the following equation to derive the updated out-phasing angle $\phi_o(t)$:

$$\varphi_o(t) = \cos^{-1}\left\{\frac{r(t)}{2A\mathscr{F}\{\hat{G}'_{ER}(t)\}}\right\}, \quad \text{Eq. (19)}$$

where $\mathscr{F}\{\hat{G}'_{ER}(t)\}$ may be the estimated envelope gain $\hat{G}'_{ER}(t)$ adjusted by the DPD function applied by the envelope to PM DPD block 450.

In this manner, the AM distortion introduced by the power amplifiers 416(a) and 416(b) may be reduced by applying an AM distortion function to the input signal x(t). Similarly, the PM distortion introduced by modulating the voltage supplies of the power amplifiers 416(a) and 416(b) may be reduced by applying a PM distortion function on the estimated envelope gain $\hat{G}'_{ER}(t)$ generated by the bandwidth limit estimator 434. The remaining components in FIG. 4 may be substantially similar in structure and operation to the corresponding numbered components in the amplifier system 300 of FIG. 3. Additionally, the DPD blocks 440 and 450 may also be integrated with the phase-clipping embodiment described with respect to FIG. 2 above by applying DPD functions to the input signal x(t) and the estimated envelope gain $\hat{G}'_{ER}(t)$ in a similar fashion.

According to another embodiment of the present invention, DPD block 440 apply PM distortion to the input signal x(t) and DPD block 450 may apply AM distortion to the estimated envelope gain $\hat{G}'_{ER}(t)$. The blocks 440 and 450 may therefore compensate for distortion introduced by the power amplifiers 416(a) and 416(b). In this embodiment, the system 400 may otherwise operate in a similar fashion as described above.

Although the foregoing techniques have been described above with reference to specific embodiments, the invention is not limited to the above embodiments and the specific configurations shown in the drawings. For example, some components shown may be combined with each other as one embodiment, or a component may be divided into several subcomponents, or any other known or available component may be added. Those skilled in the art will appreciate that these techniques may be implemented in other ways without departing from the spirit and substantive features of the invention. The present embodiments are therefore to be considered in all respects as illustrative and not restrictive.

What is claimed is:

1. An amplifier system comprising:
   a linear amplification using non-linear components (Linc) processing system to receive an input signal and decompose the signal into two vector signals to be amplified by a pair of power amplifiers and combined;
   an envelope restoration (ER) processing system to estimate an envelope of the input signal and generate a bandwidth-limited envelope gain to modulate a supply voltage of each power amplifier; and
   a feedback path from the ER processing system to the Linc processing system to provide information about the bandwidth-limited envelope gain to the Linc processing system,
   wherein the feedback path comprises a bandwidth limit estimator to generate an estimate of the bandwidth-limited envelop gain.

2. The amplifier system of claim 1, wherein:
   the Linc processing system comprises an out-phasing generator to receive the input signal and decompose the signal into the two vector signals, each having an out-phasing angle, a limiting device to modify the vector signals based on a predetermined value limit, and a power combiner to combine the vector signals after amplification;
   the ER processing system comprises an envelope gain generator to generate an estimate of an envelope of the input signal and an envelope amplifier to amplify the estimate of the envelope of the input signal and output the bandwidth limited envelope gain.

3. The amplifier system of claim 2, wherein the out-phasing angle is an absolute difference between a phase of the input signal and a phase of each of the vector signals.

4. The amplifier system of claim 2, wherein the out-phasing generator generates an updated out-phasing angle based on the information about the bandwidth-limited envelope gain.

5. The amplifier system of claim 2, wherein the modifying comprises clipping the out-phasing angles of the vector signals, the value limit is a phase clipping angle, and the limiting device dips the out-phasing angles of the vector signals to the phase clipping angle if the out-phasing angles are greater than the phase clipping angle.

6. The amplifier system of claim 2, wherein the modifying comprises de-troughing amplitudes of the vector signals, the value limit is a minimum amplitude, and the limiting device de-troughs the amplitudes of the vector signals to the minimum amplitude if the amplitudes are lower than the minimum amplitude.

7. The amplifier system of claim 2, further comprising a digital pre-distortion device to apply a pre-distortion function on the estimate of the bandwidth-limited envelope gain prior to being input into the out-phasing generator.

8. A method comprising:
receiving an input signal and decomposing, using an out-phase generator, the signal into two vector signals, each having an out-phasing angle;
amplifying each vector signal using first and second power amplifiers;
modulating a supply voltage of each power amplifier based on an envelope of the input signal;
generating an estimate of the bandwidth-limited envelope gain of the input signal and feeding back the estimate into the out-phasing generator; and
combining the amplified vector signals; and
generating an updated out-phasing angle based on the estimate of the bandwidth-limited envelope gain of the input signal.

9. The method of claim 8, further comprising modifying the vector signals, using a limiting device, based on a predetermined value limit.

10. The method of claim 8, wherein the out-phasing angle is an absolute difference between a phase of the input signal and a phase of each of the vector signals.

11. The method of claim 9, wherein the modifying comprises clipping the out-phasing angles of the vector signals, the value limit is a phase dipping angle, and the limiting device clips the out-phasing angles of the vector signals to the phase dipping angle if the out-phasing angles are greater than the phase clipping angle.

12. The method of claim 9, wherein the modifying comprises de-troughing amplitudes of the vector signals, the value limit is a minimum amplitude, and the limiting device de-troughs the amplitudes of the vector signals to the minimum amplitude if the amplitudes are lower than the minimum amplitude.

13. The method of claim 9, further comprising applying, using a digital pre-distortion device, a pre-distortion function on the estimate of the envelope of the input signal prior to being input into the out-phasing generator.

14. An apparatus comprising:
a linear amplification using non-linear components (Linc) processing system to receive an input signal and decompose the signal into two vector signals to be amplified by a pair of power amplifiers and combined;
an envelope restoration (ER) processing system to estimate an envelope of the input signal and generate a bandwidth-limited envelope gain to modulate a supply voltage of each power amplifier; and
a feedback path from the ER processing system to the Linc processing system to provide information about the bandwidth-limited envelope gain to the Linc processing system,
wherein the feedback path comprises a bandwidth limit estimator to generate an estimate of the bandwidth-limited envelop gain.

15. The apparatus of claim 14, wherein:
the Linc processing system comprises an out-phasing generator to receive the input signal and decompose the signal into the two vector signals, each having an out-phasing angle, a limiting device to modify the vector signals based on a predetermined value limit, and a power combiner to combine the vector signals after amplification;
the ER processing system comprises an envelope gain generator to generate an estimate of an envelope of the input signal and an envelope amplifier to amplify the estimate of the envelope of the input signal and output the bandwidth limited envelope gain.

16. The apparatus of claim 15, wherein the out-phasing angle is an absolute difference between a phase of the input signal and a phase of each of the vector signals.

17. The apparatus of claim 15, wherein the out-phasing generator generates an updated out-phasing angle based on the information about the band-limited envelope gain.

18. The apparatus of claim 15, wherein the modifying comprises dipping the out-phasing angles of the vector signals, the value limit is a phase clipping angle, and the limiting device clips the out-phasing angles of the vector signals to the phase clipping angle if the out-phasing angles are greater than the phase dipping angle.

19. The apparatus of claim 15, wherein the modifying comprises de-troughing amplitudes of the vector signals, the value limit is a minimum amplitude, and the limiting device de-troughs the amplitudes of the vector signals to the minimum amplitude if the amplitudes are lower than the minimum amplitude.

20. The apparatus of claim 15, further comprising a digital pre-distortion device to apply a pre-distortion function on the estimate of the bandwidth-limited envelope gain prior to being input into the out-phasing generator.

* * * * *